(12) United States Patent
Cheng et al.

(10) Patent No.: US 10,910,494 B2
(45) Date of Patent: Feb. 2, 2021

(54) METHOD AND STRUCTURE FOR FORMING VERTICAL TRANSISTORS WITH VARIOUS GATE LENGTHS

(71) Applicant: International Business Machines Corporation, Armonk, NY (US)

(72) Inventors: Kangguo Cheng, Schenectady, NY (US); Shogo Mochizuki, Clifton Park, NY (US); Choonghyun Lee, Rensselaer, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/600,701

(22) Filed: Oct. 14, 2019

(65) Prior Publication Data

US 2020/0052114 A1 Feb. 13, 2020

Related U.S. Application Data

(62) Division of application No. 16/008,207, filed on Jun. 14, 2018, now Pat. No. 10,475,923.

(51) Int. Cl.
*H01L 29/78* (2006.01)
*H01L 29/66* (2006.01)
(Continued)

(52) U.S. Cl.
CPC ...... *H01L 29/7827* (2013.01); *H01L 21/0257* (2013.01); *H01L 21/02381* (2013.01); *H01L 21/02433* (2013.01); *H01L 21/02532* (2013.01); *H01L 21/3065* (2013.01); *H01L 21/30604* (2013.01); *H01L 21/823418* (2013.01);
(Continued)

(58) Field of Classification Search
CPC ............... H01L 29/7827; H01L 29/785; H01L 29/6656; H01L 29/6653; H01L 29/66272; H01L 29/1073; H01L 21/02532; H01L 21/02433; H01L 21/0257; H01L 21/823456; H01L 21/823418; H01L 21/30604; H01L 21/3065; H01L 27/088
USPC ........ 257/329, 401, 314, 369, 350, E29.001, 257/E29.147, E29.195, E29.263, E21.177, 257/E21.362, E21.645, E21.703, E27.112, 257/E27.081; 438/427, 283, 197
See application file for complete search history.

(56) References Cited

U.S. PATENT DOCUMENTS 9,331,209 B2   5/2016   Jain
9,455,201 B2   9/2016   Joshi et al.
(Continued)

OTHER PUBLICATIONS

List of IBM Patents or Patent Applications Treated as Related.

*Primary Examiner* — Dao H Nguyen
(74) *Attorney, Agent, or Firm* — Fleit Intellectual Property Law; Jose Gutman

(57) ABSTRACT

Various methods and structures for fabricating a plurality of vertical fin FETs on the same semiconductor substrate in which a first gate length of a first gate in a first vertical fin FET is less than a second gate length of a second gate in a second vertical fin FET. A difference in gate lengths between different vertical fin FETs can be precisely fabricated by using atomic layer silicon germanium epitaxy. Gate length offset is formed at a bottom source/drain junction region of each vertical fin FET transistor, which allows downstream processing for all vertical fin FET transistors to be the same.

15 Claims, 10 Drawing Sheets

(51) Int. Cl.
  *H01L 27/088* (2006.01)
  *H01L 29/08* (2006.01)
  *H01L 21/8234* (2006.01)
  *H01L 21/306* (2006.01)
  *H01L 29/10* (2006.01)
  *H01L 29/06* (2006.01)
  *H01L 21/02* (2006.01)
  *H01L 21/3065* (2006.01)

(52) U.S. Cl.
  CPC ........... *H01L 21/823456* (2013.01); *H01L 21/823468* (2013.01); *H01L 21/823487* (2013.01); *H01L 27/088* (2013.01); *H01L 29/0688* (2013.01); *H01L 29/0847* (2013.01); *H01L 29/1037* (2013.01); *H01L 29/6653* (2013.01); *H01L 29/6656* (2013.01); *H01L 29/66272* (2013.01); *H01L 29/66666* (2013.01); *H01L 29/785* (2013.01)

(56) References Cited

U.S. PATENT DOCUMENTS

| | | |
|---|---|---|
| 9,570,356 B1 | 2/2017 | Balakrishnan et al. |
| 9,653,465 B1 | 5/2017 | Balakrishnan et al. |
| 9,837,553 B1 | 12/2017 | Wu et al. |
| 9,935,018 B1 * | 4/2018 | Xie ................. H01L 21/823885 |
| 10,249,538 B1 * | 4/2019 | Qi ................... H01L 21/823456 |
| 2009/0303371 A1 | 12/2009 | Watanabe et al. |
| 2019/0148372 A1 * | 5/2019 | Miao ............... H01L 21/823475 257/329 |
| 2019/0214305 A1 * | 7/2019 | Bao .................... H01L 21/3081 |

* cited by examiner

METHOD AND STRUCTURE FOR FORMING VERTICAL TRANSISTORS WITH VARIOUS GATE LENGTHS

BACKGROUND

The present invention generally relates to the field of semiconductors, and more particularly relates to a method of fabricating vertical transistor structures on semiconductor chips.

Fin field-effect transistor (fin FET) devices include a transistor architecture that uses raised source-to-drain channel regions, referred to as fins. A fin FET device can be built on a semiconductor substrate, where a semiconductor material, such as silicon, is patterned into a fin-like shape and functions as the channel of the transistor. Known fin FET devices include fins with source/drain regions on lateral sides of the fins, so that current flows in a horizontal direction (e.g., parallel to the semiconductor substrate) between source/drain regions at opposite ends of the fins in the horizontal direction.

More recently, vertical fin field-effect transistors have been explored. This vertical arrangement of a transistor device can help increase the number of transistors that can fit on a chip without having to substantially increase the overall chip size. Vertical transport architecture FET devices include source/drain layers at ends of vertically oriented fins, i.e., on top and bottom sides of the vertical fins, so that current flows through the fins in a vertical direction (e.g., perpendicular to the semiconductor substrate) between a bottom source/drain layer and a top source/drain layer.

Different transistors on the same chip can be used for different performance and power applications. The gate length of a fin FET can be varied to vary the performance and the power consumption in the transistor. The shorter gate length transistors have higher performance (e.g., higher speed) and higher power consumption, while the longer gate length transistors have lower performance (e.g., lower speed) and lower power consumption. Circuit designs can trade-off power and performance parameters by varying the gate length of the transistors.

It is difficult to get different gate lengths for different vertical fin FET devices on the same chip because the gate length in a vertical fin FET device is not defined by lithography.

SUMMARY OF THE INVENTION

Various embodiments of the present invention include fabrication of multiple vertical fin FET transistor devices having different gate lengths for different vertical transistors on the same circuit supporting substrate.

A semiconductor structure, according to an embodiment of the invention, comprises: a first vertical fin field-effect transistor formed on a semiconductor substrate, the first vertical fin field-effect transistor comprising a first vertical fin, a first bottom source/drain junction region disposed on the semiconductor substrate and a first gate disposed on the first bottom source/drain junction region, the first gate having a first gate length; and a second vertical fin field-effect transistor formed on the semiconductor substrate, the second vertical fin field-effect transistor comprising a second vertical fin, a second bottom source/drain junction region disposed on the semiconductor substrate and a second gate disposed on the second bottom source/drain junction region, the second gate having a second gate length that is greater than the first gate length, the first vertical fin including a staircase feature inside the first bottom source/drain layer and the second vertical fin does not include a staircase feature inside the second bottom source/drain layer.

In certain embodiments, an integrated circuit comprises a circuit supporting substrate; and the a semiconductor structure described above.

According to one embodiment, a semiconductor structure comprises: a first vertical fin field-effect transistor (first vertical fin FET) disposed directly on a substrate, the first vertical comprising: a first fin that extends vertically from the substrate, a bottom source/drain layer at a bottom end of the first fin on the substrate, a bottom spacer layer disposed directly on the bottom source/drain layer, a first gate having a first length extending vertically along the first fin from the bottom spacer layer to a top spacer layer disposed directly on the first gate, and a top source/drain layer disposed on the top spacer layer; and a second vertical fin field-effect transistor (second vertical) disposed directly on the substrate, the second vertical fin FET comprising: a second fin that extends vertically from the substrate, a bottom source/drain layer at a bottom end of the second fin on the substrate, a bottom spacer layer disposed directly on the bottom source/drain layer, a second gate having a second length extending vertically along the second fin from the bottom spacer layer to a top spacer layer disposed directly on the second gate, and a top source/drain layer disposed on the top spacer layer; and wherein the first length of the first gate is smaller than the second length of the second gate; and wherein the first fin includes a staircase feature inside the bottom source/drain layer of the first vertical fin FET and the second fin does not include a staircase feature inside the bottom source/drain layer of the second vertical fin FET.

A method of semiconductor fabrication can fabricate an integrated circuit comprising the semiconductor structure described above.

A method of fabricating a semiconductor structure, according to various embodiments, comprises: patterning a semiconductor stack to form on a semiconductor substrate a first vertical fin in a first vertical fin region and a second vertical fin in a second vertical fin region; epitaxially growing a sacrificial semiconductor material on the semiconductor substrate wherein the sacrificial semiconductor material covers a lower portion of the first vertical fin and the second vertical fin; removing the sacrificial semiconductor material in the second vertical fin region while leaving the sacrificial semiconductor material in the first vertical fin region; forming a sidewall spacer on the first vertical fin and on the second vertical fin; contemporaneously etching the sacrificial semiconductor material and a portion of the semiconductor substrate in the first vertical fin region, and a portion of the semiconductor substrate in the second vertical fin region; removing the sacrificial semiconductor material in the first vertical fin region; forming a first bottom source/drain layer on the sidewalls of the first vertical fin; and forming a second bottom source/drain layer on the sidewalls of the second vertical fin.

In a certain embodiment, a method for fabricating a semiconductor structure comprises a first vertical fin field-effect transistor (first vertical) disposed on a semiconductor substrate and a second vertical fin field-effect transistor (second vertical) disposed on the semiconductor substrate, a first gate of the first vertical having a first length vertically along a first vertical fin and a second gate of the second vertical having a second length vertically along a second vertical fin, and wherein the first length of the first gate is smaller than the second length of the second gate, the method comprises: depositing a hard mask layer on a semiconductor substrate; performing vertical directional etching on the hard mask layer and the semiconductor substrate to form a first vertical fin and a second vertical fin, both first and second vertical fins disposed adjacent to each other directly on and extending vertically from a top surface of the semiconductor substrate, and each of the first and second vertical fins having a hard mask layer cap on top of the respective vertical fin; epitaxially growing a sacrificial silicon germanium (SiGe) layer directly on the top surface of the semiconductor substrate between the adjacent first and second vertical fins by cyclic epitaxy process that includes cyclic epitaxy growth followed by etch back to grow SiGe on horizontal planes on the top surface of the semiconductor substrate; depositing a block mask to cover a first fin region that includes the first vertical fin and excludes the second vertical fin; performing etching to remove the SiGe layer from a second fin region that includes the second vertical fin and excludes the first vertical fin; stripping the block mask from the first fin region; forming sidewall spacers on the sidewalls of the first vertical fin and on the sidewalls of the second vertical fin by deposition followed by vertical directional etching; performing vertical directional etching to remove the SiGe layer that is vertically exposed outside of the sidewall spacers on the sidewalls of the first vertical fin; performing vertical directional etching to etch the semiconductor substrate to lower a top surface of the semiconductor substrate in the second vertical fin region to a vertical level below a top surface of the semiconductor substrate in the first vertical fin region; selectively removing by etching the SiGe from the sidewalls of the first vertical fin directly below the sidewall spacers on the sidewalls of the first vertical fin; epitaxially growing a bottom source/drain layer from the top surface of the semiconductor substrate to a level of a bottom surface of the sidewall spacers on the sidewalls of the first vertical fin in the first fin region and to a level of a bottom surface of the sidewall spacers on the sidewalls of the second vertical fin in the second fin region, the first vertical fin including a staircase feature inside the bottom source/drain layer in the first fin region and the second vertical fin not including a staircase feature inside the bottom source/drain layer in the second fin region; and performing vertical transistor fabrication process steps on both the first fin region and on the second fin region to: remove the sidewall spacers from respective first vertical fin and second vertical fin; form a bottom spacer layer directly on the top surface of the bottom source/drain layer in the first fin region and the bottom source/drain layer in the second fin region; form a first gate having a first length vertically along the first vertical fin and disposed directly on the bottom spacer in the first fin region and a second gate having a second length vertically along the second vertical fin and disposed directly on the bottom spacer in the second fin region, the first length of the first gate being smaller than the second length of the second gate; form a top spacer layer directly on a top surface of the first gate in the first fin region and a top spacer layer directly on a top surface the second gate in the second fin region; deposit interlevel dielectric fill in the first fin region and in the second fin region; and epitaxially grow a top source/drain layer on a top surface of the top spacer layer in the first fin region to form a first vertical fin FET, and a top source/drain layer on a top surface of the top spacer layer in the second fin region to form a second vertical fin FET.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
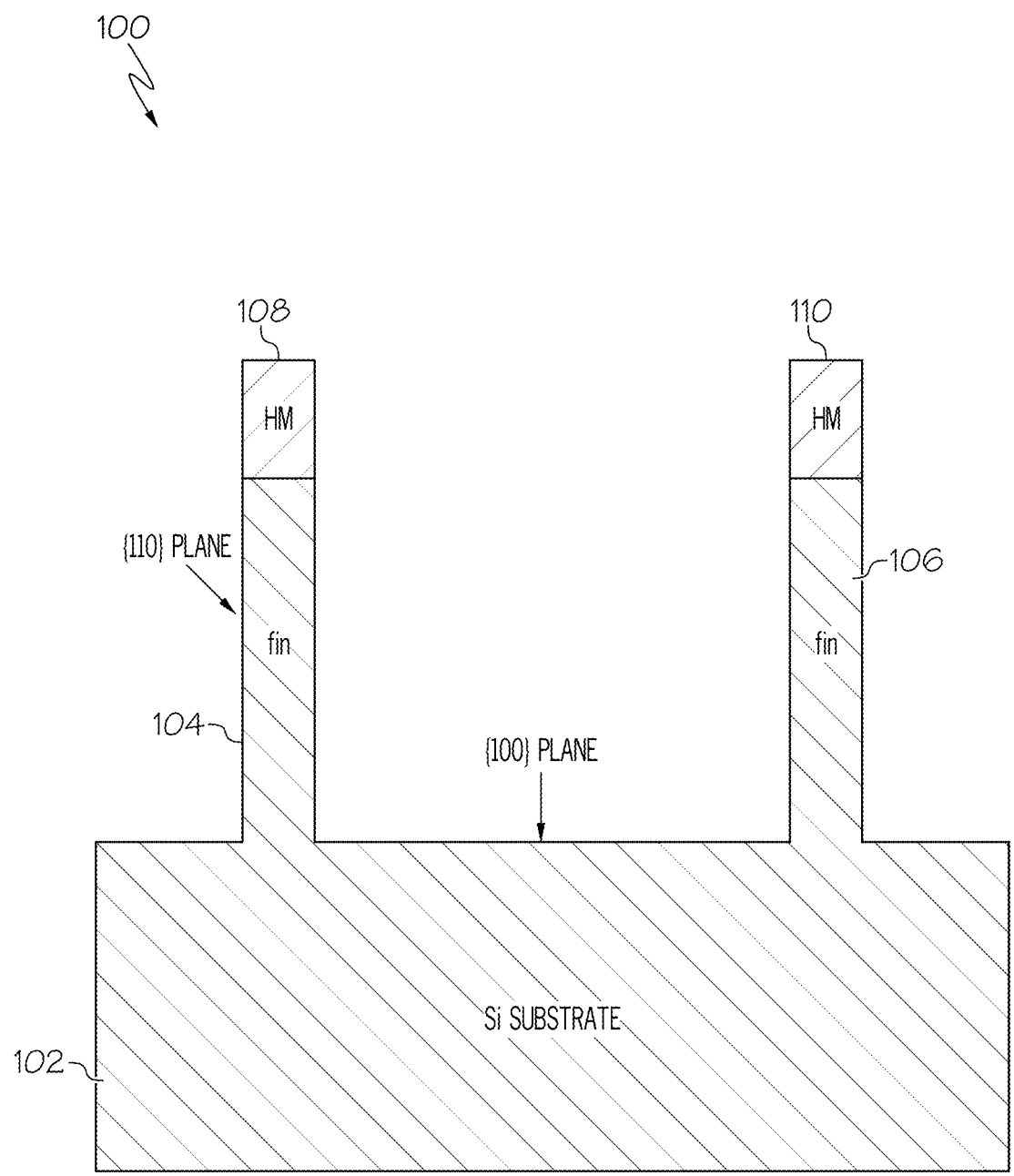
FIG. 1 is a cross-sectional side view of an example of a partial semiconductor structure illustrating first and second vertical fins formed on a semiconductor substrate in an example fabrication process, according to an embodiment of the present invention.

According to various embodiments of the invention, as will be discussed below, one advantage is that different vertical transistors on the same chip can be fabricated to have respective different gate lengths, with good control of precisely fabricating a specific gate length difference between the different vertical transistors on the same semiconductor substrate by using atomic layer silicon germanium (SiGe) epitaxy. It should be noted that different vertical fin FETs on the same semiconductor substrate can be used for different performance and power applications. The gate length of a vertical fin FET can be varied in a fabrication process to vary the performance and the power consumption of the vertical fin FET. The shorter gate length vertical transistors have higher performance (e.g., higher speed) and higher power consumption, while the longer gate length vertical transistors have lower performance (e.g., lower speed) and lower power consumption. According to various embodiments, circuit designs can trade-off power and performance parameters by varying the gate length of the vertical transistors.

A second advantage is that gate length offset is formed at a bottom source/drain junction region of each vertical transistor, which allows downstream processing for all vertical transistors to be the same. Therefore, the downstream fabrication process can be standardized for all vertical transistor devices, e.g., the same source/drain junction profile, the same gate dielectric, and the same gate metal, for all vertical transistors. Standardized fabrication for all the vertical transistors on a semiconductor substrate can significantly reduce semiconductor chip fabrication costs.

It is to be understood that the present invention will be described in terms of illustrative example processes for fabricating fin FET semiconductor devices and vertical transistor semiconductor devices. However, other semiconductor architectures, structures, substrate materials, and process features and steps may be varied within the scope of the present invention.

It will also be understood that when an element such as a layer, region or substrate is referred to as being "on" or "over" another element, it can be directly on the other element or intervening elements may also be present. Similar but inverse meaning will be understood for an element such as a layer, region, or substrate that is referred to as being "under" or "below" another element. It can be directly under the other element or intervening elements may also be present. In contrast, when an element is referred to as being "directly on" or "directly over", or alternatively referred to as being "directly under" or "directly below" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present example embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used as part of a process in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be understood that the various layers and/or regions shown in the accompanying drawings are not drawn to scale, and that one or more layers and/or regions of a type commonly used in complementary metal-oxide semiconductor (CMOS), fin field-effect transistor (fin FET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with various embodiments of the present invention can be employed in applications, hardware, and/or electronic systems. Suitable electronic hardware and systems for implementing embodiments of the invention may include, but are not limited to, personal computers, communication networks, electronic commerce systems, portable communications devices (e.g., cellular and smart phones), solid-state media storage devices, functional circuitry, etc. Systems and hardware incorporating the semiconductor devices and structures are contemplated embodiments of the invention. Given the teachings of example embodiments of the invention provided herein, one of ordinary skill in the art will be able to contemplate other implementations and applications of embodiments of the invention.

Various embodiments of the present invention can be implemented in connection with semiconductor devices, and related semiconductor fabrication processes, that may use CMOSs, MOSFETs and/or fin FETs technology. By way of non-limiting example, the semiconductor devices can include, but are not limited to CMOS, MOSFET, and fin FET devices, and/or semiconductor devices that use CMOS, MOSFET and/or fin FETtechnology.

As used herein, "vertical" refers to a direction perpendicular to a substrate in the cross-sectional and three-dimensional views herein. Current between source/drain layers can be described herein as flowing in a vertical direction (e.g., between a bottom source/drain layer and a top source/drain layer) through a fin channel region. As used herein, "horizontal" refers to a direction parallel to a substrate in the cross-sectional and three-dimensional views herein.

As used herein, "thickness". "thick", or the like, refers to a size of an element (e.g., a layer, trench, hole, etc.) in the cross-sectional views measured from a bottom surface to a top surface, or from a left side surface to a right side surface of the element, and/or measured with respect to a surface directly adjacent to and contacting the element (e.g., a surface on which the element is directly disposed on).

Unless otherwise specified, as used herein, "height" or "height above a substrate" refers to a vertical size of an element (e.g., a layer, trench, hole, etc.) in the cross-sectional views measured from a top surface of the substrate to a top surface of the element. A thickness of an element can be equal to a height of the element if the element is directly on the substrate.

As used herein, the terms "lateral," "lateral side," "lateral surface" refer to a side surface of an element (e.g., a layer, opening, etc.), such as a left or right side surface in the cross-sectional views herein.

Various embodiments of the present invention include a plurality of fins on the same semiconductor substrate on a wafer. This structure may be used, for example, to create CMOS devices in an integrated circuit.

Referring now to the drawings in which like numerals represent the same or similar elements, FIG. 1 shows an example of a semiconductor structure 100 comprising a semiconductor substrate 102, e.g., a silicon wafer, having a top surface with a horizontal plane crystalline natural orientation {100}. According to an example semiconductor fabrication process, a hardmask layer, e.g., silicon nitride, is deposited on the top surface of the semiconductor substrate 102. The hardmask layer on the semiconductor substrate 102, and optionally including one or more other semiconductor layers disposed on the semiconductor substrate 102, constitute a semiconductor stack. The fabrication process patterns the semiconductor stack to form a plurality of vertical fins 104, 106, each having a fin hardmask cap 108, 110. The fabrication process can pattern the silicon nitride layer and the silicon substrate 102 by any suitable patterning technique, for example using lithography followed by etching, such as by a multi-patterning process or by a direct print patterning process, to form the vertical fins 104, 106, with each having a fin hardmask cap 108, 110.

More specifically, a first fin 104 has a first fin hardmask cap 108 and a second fin 106 has a second fin hardmask cap 110. The first fin 104 and the second fin 106 vertically extend upwards from the top surface of the semiconductor substrate 102. The sidewalls of the two fins 104, 106, have a vertical plane crystalline natural orientation {110}. It should be noted that the crystalline natural orientation {110} of the sidewalls naturally results from the patterning fabrication process to form the fins 104, 106. The crystalline natural orientation {110} of the sidewalls is different from the crystalline natural orientation {100} of the top surface of the semiconductor substrate 102.

Figure 2:
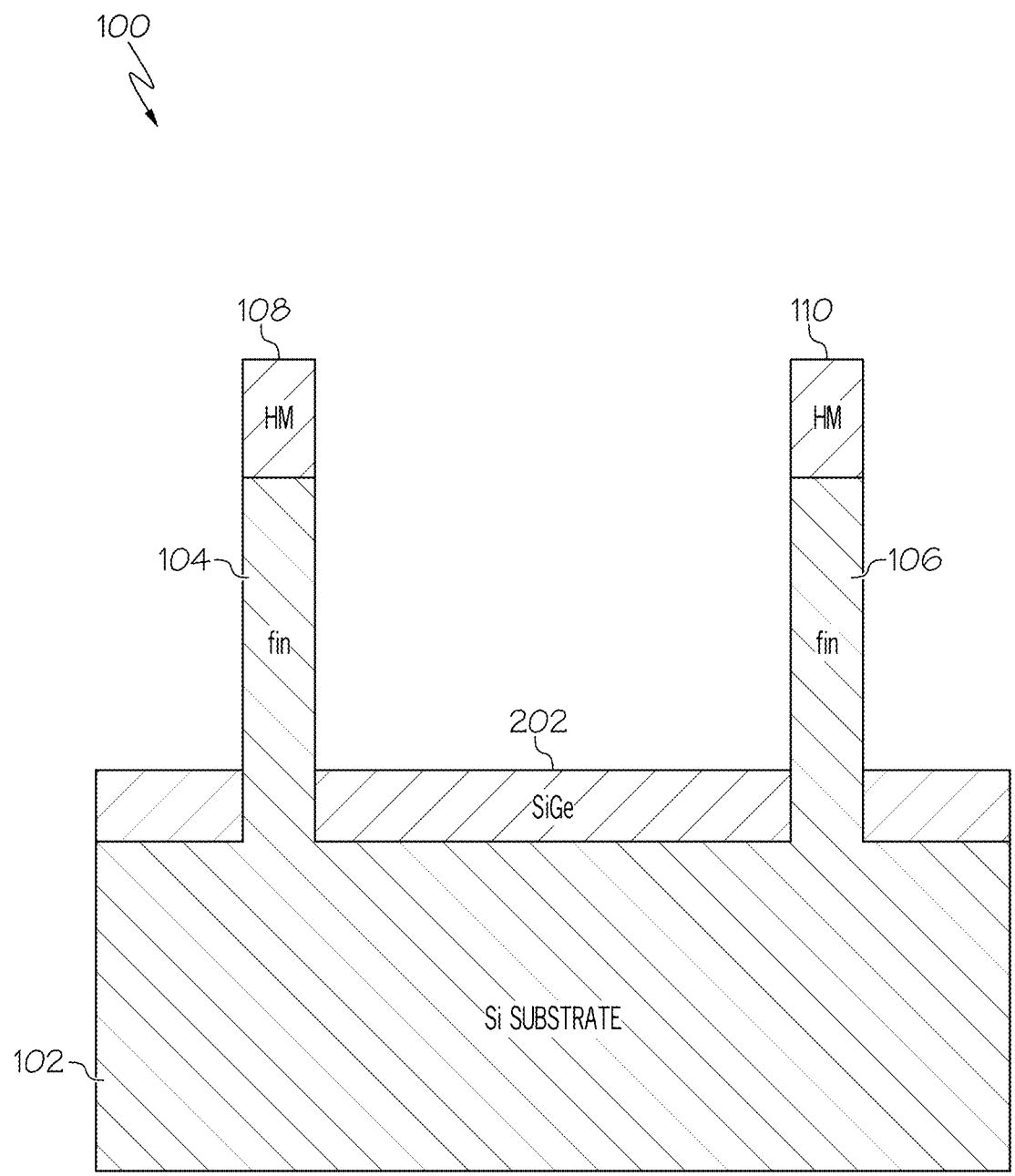
FIG. 2 is a cross-sectional side view of the partial semiconductor structure of FIG. 1 at a point in the example fabrication process following epitaxial growth of a silicon germanium layer on the semiconductor substrate.

The fabrication process continues, as shown in FIG. 2, by epitaxially growing a sacrificial semiconductor material such as silicon germanium (SiGe) on the top surface of the semiconductor substrate 102 between the fins 104, 106. That is, as will be discussed in more detail below, atomic layer silicon germanium epitaxy can be used to precisely control gate length difference between different vertical fin field-effect transistors (FETs) (e.g., see the fins 104, 106, in FIG. 2, used to fabricate different vertical fin FETs), on the same semiconductor substrate 102. In some embodiments, the epitaxial growth can be performed, for example and not for any limitation, by a cyclic epitaxy process that includes cyclic epitaxy growth of the SiGe material. The epitaxy growth of the SiGe layer tends to grow faster on the crystalline natural orientation {100} of the top surface of the semiconductor substrate 102 and on the silicon germanium horizontal {100} plane, as compared to the epitaxy growth of the SiGe material at a region in contact with the crystalline natural orientation {110} of the sidewalls. The crystalline orientation affects the epitaxial growth rate for the SiGe layer. In each cycle of process, SiGe grows on both {100} and {110} planes. However, after etch growth cycle, SiGe is thicker on {100} planes than that on {110} planes. Each cycle of growth is followed by etching back to remove SiGe on the {110} vertical fin sidewalls while leaving a portion of SiGe on horizontal {100} substrate. The cyclic epitaxy repeats until a desired thickness of SiGe is formed on the semiconductor substrate 102. In some embodiments, the SiGe thickness ranges from 3 nm to 10 nm. Of course, other semiconductor fabrication methods could be used to form the SiGe layer 202 on the semiconductor substrate 102.

The cyclic epitaxy process, according to the present example, can grow silicon germanium horizontal {100} planes, one on top of the other, until a desired thickness of a SiGe layer 202 is obtained. After each cycle of growing silicon germanium thicker on a horizontal {100} plane and thinner on a vertical {110} plane, an etching process removes SiGe on {110} planes and leaves SiGe on the horizontal {100} plane resulting in a horizontally flat silicon germanium material (i.e., having a constant height horizontally across the entire SiGe plane.

In summary, according to the cyclic epitaxy process used in the present example, an etching process is used to etch back any uneven growth of the silicon germanium on the horizontal {100} plane, which thereby results in a horizontally flat silicon germanium layer 202 (i.e., having a constant height horizontally across the entire SiGe layer 202). Cycle after cycle of the cyclic epitaxy process are performed to incrementally, and precisely, grow a silicon germanium layer 202 on flat horizontal {100} planes until a desired height is reached for the silicon germanium layer 202 on the top surface of the semiconductor substrate 102.

Figure 3:
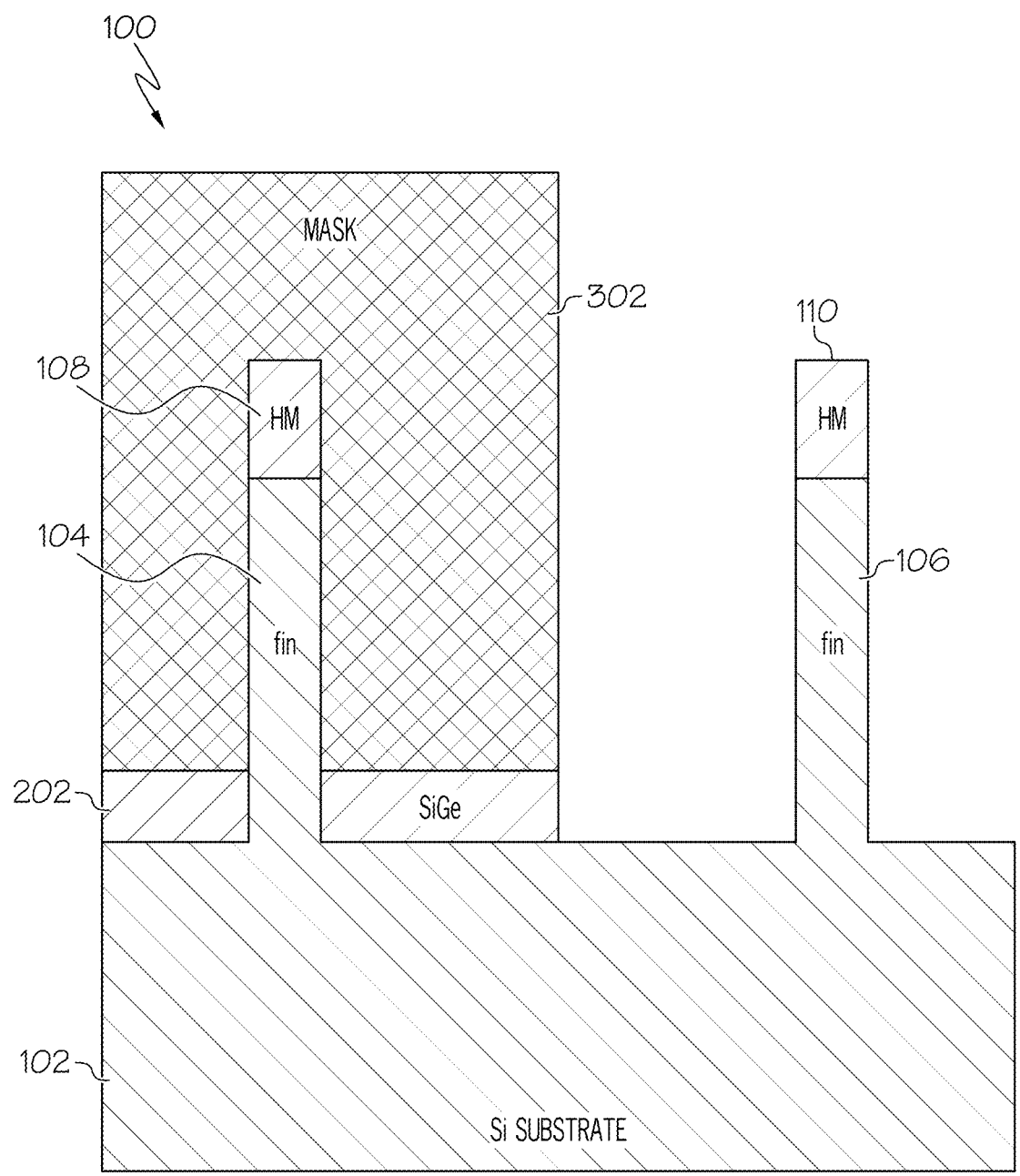
FIG. 3 is a cross-sectional side view of the partial semiconductor structure of FIG. 2 at a point in the example fabrication process following deposition of a block mask to cover the first fin in a first fin region on the semiconductor substrate while leaving exposed (uncovered) the second fin in a second fin region on the semiconductor substrate.

As shown in FIG. 3, the fabrication process continues by depositing a block mask 302 covering the first fin 104 and the first fin hardmask cap 108 in a first fin region on the semiconductor substrate 102, while leaving exposed (not covering with the block mask 302) the second fin 106 in a second fin region on the semiconductor substrate 102. An etching process removes the SiGe material 202 from the second fin region on the semiconductor substrate 102. Etching SiGe selective to silicon and other material can be done by any suitable process, including but not limited to, a wet etch solution containing ammonia and hydrogen peroxide, a gas phase hydrogen chloride, etc.

Figure 4:
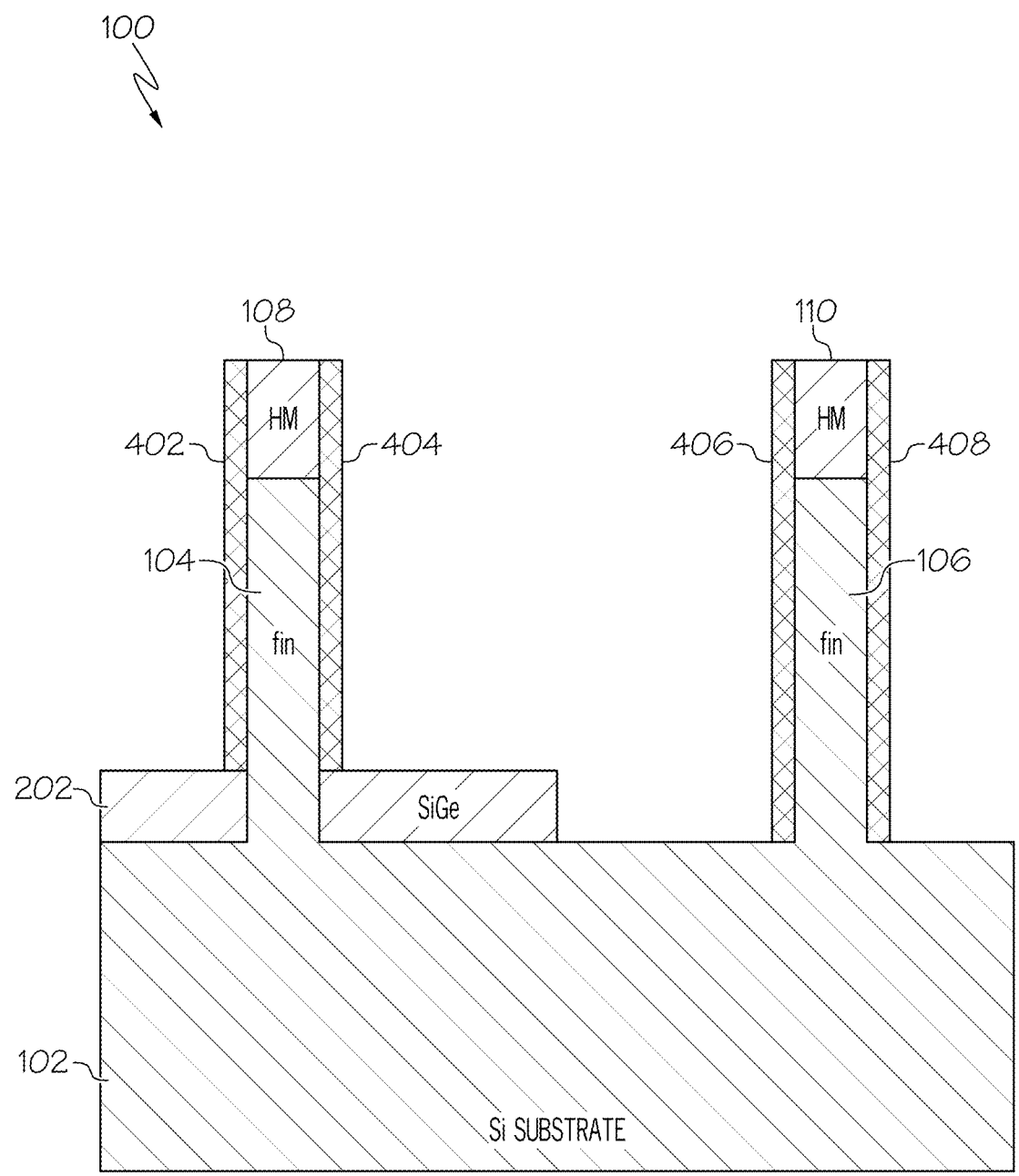
FIG. 4 is a cross-sectional side view of the partial semiconductor structure of FIG. 3 at a point in the example fabrication process following selective sidewall spacers deposition on the sidewalls of the first fin and the second fin.

As shown in FIG. 4, an etching process removes the silicon germanium layer 202 from the second fin region, while leaving intact the silicon germanium layer 202 in the first fin region where covered by the block mask 302. The block mask 302 is then stripped from the semiconductor structure 100, e.g., removed by using a dry etch process. For example, a block mask comprising photoresist can be removed by an ashing process with oxygen plasma.

Sidewall spacers 402, 404, 406, 408, shown in FIG. 4, are formed on the sidewalls of the first fin 104 and cap 108 and on the sidewalls of the second fin 106 and cap 110, by deposition of a sidewall spacer material layer (e.g., silicon nitride, SiN) followed by vertical directional etching. The sidewall spacer material can be deposited by any suitable process, including but not limited to, chemical vapor deposition (CVD), atomic layer deposition (ALD), etc. An example of a vertical directional etching process that etches the sidewall spacer material layer can be a reactive ion etching (RIE) process.

Figure 5:
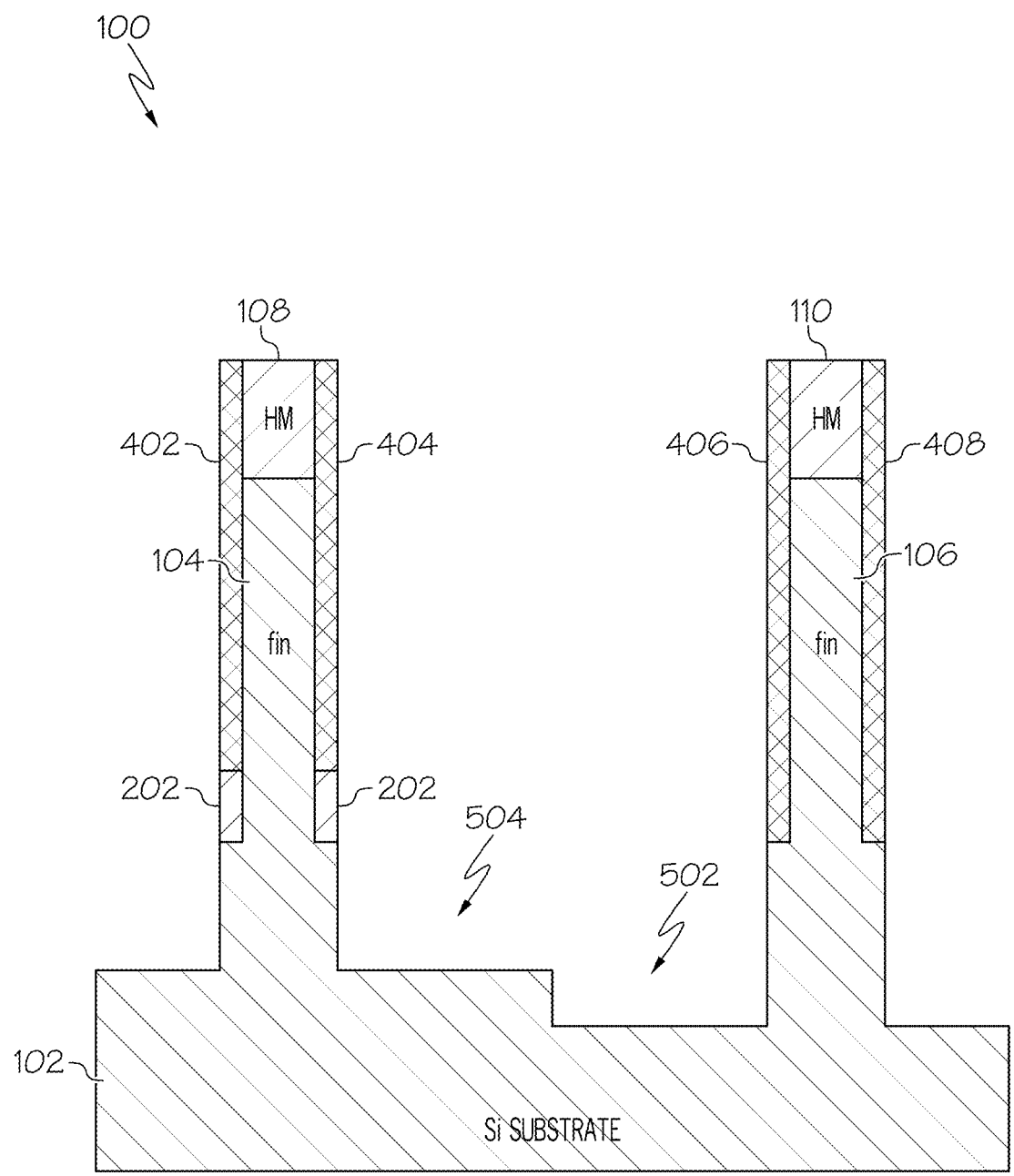
FIG. 5 is a cross-sectional side view of the partial semiconductor structure of FIG. 4 at a point in the example fabrication process following patterning and vertical directional etching of the partial semiconductor structure.

Continuing the semiconductor fabrication process, with reference to FIG. 5, a vertical directional etching step vertically etches and removes the SiGe layer 202 where SiGe layer 202 is vertically exposed outside of the sidewall spacers 402, 404, in the first fin region. The process contemporaneously etches the sacrificial semiconductor material (SiGe layer) and a portion of the semiconductor substrate in the first vertical fin region, and a portion of the semiconductor substrate in the second vertical fin region. The semiconductor structure 100 shown in FIG. 5 can be achieved by dry etching SiGe layer 202 and the top surface of the semiconductor substrate 102 using a vertical directional etching process. The sidewall spacers 402, 404, in the first fin region act as a mask and the vertical directional etching leaves intact a portion of the SiGe material 202 directly below the sidewall spacers 402, 404. The vertical directional etching process can be performed, for example, by using a fluoride based chemistry.

Figure 6:
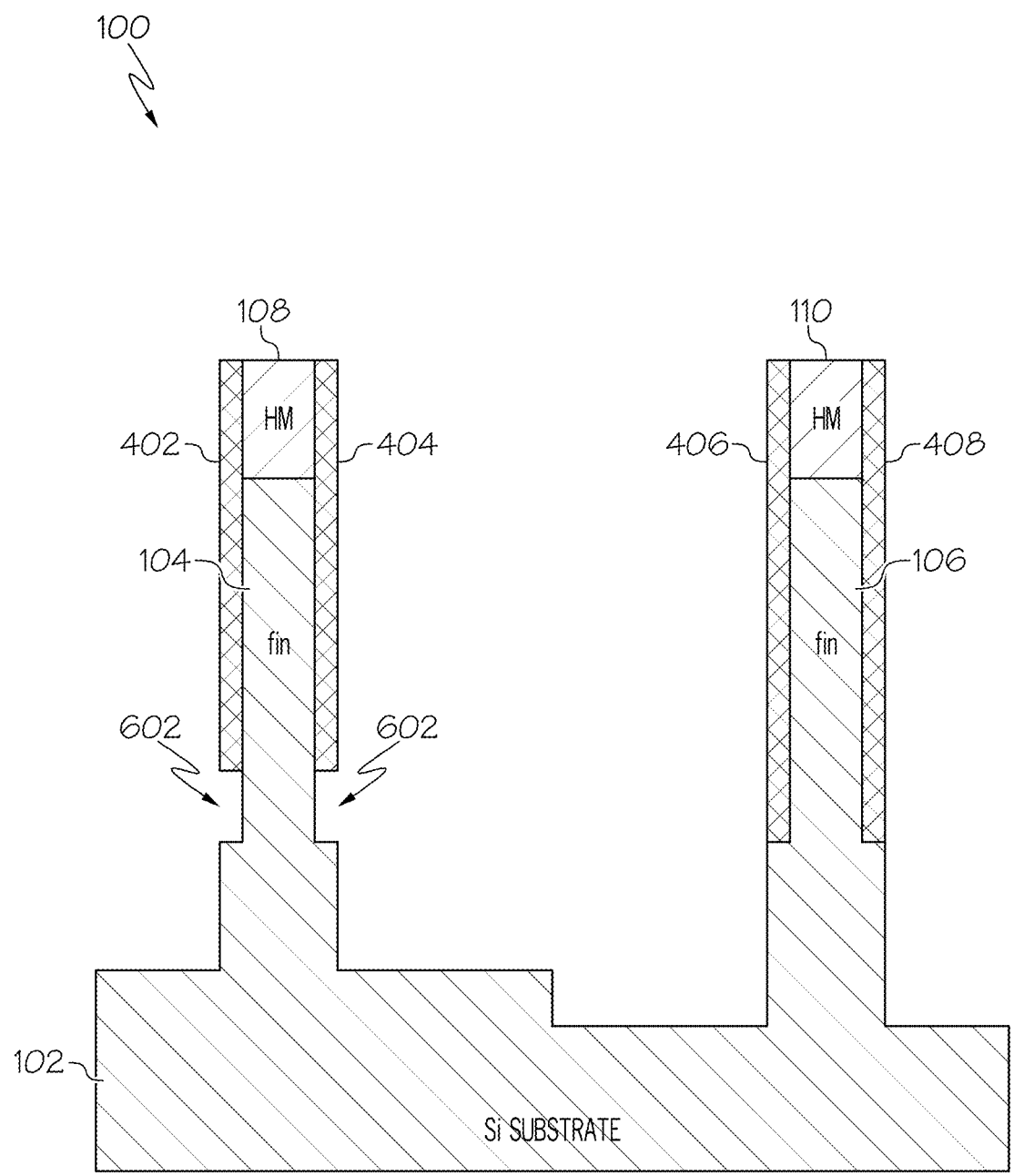
FIG. 6 is a cross-sectional side view of the partial semiconductor structure of FIG. 5 at a point in the example fabrication process following selective removal of the silicon germanium material from the first fin region.

As shown in FIG. 5, the vertical directional etching step has vertically etched into the Si substrate 102 in the first fin region to a first level 504 and in the second fin region to a second level 502. The second level 502 of the top surface of the Si substrate 102 in the second vertical fin region is etched to a lower horizontal level than the first level 504 of the top surface of the Si substrate 102 in the first vertical fin region. That is, a horizontal level of the top surface of the Si substrate 102 in the second fin region is below a horizontal level of the top surface of the Si substrate 102 in the first fin region. Then, as shown in FIG. 6, the remaining SiGe layer 202 is removed from the first fin region by any suitable SiGe etch process such as described above. See the recesses 602 formed by removal of the SiGe material 202 adjacent to the first fin 104. The resulting structure is shown in FIG. 6.

Figure 7:
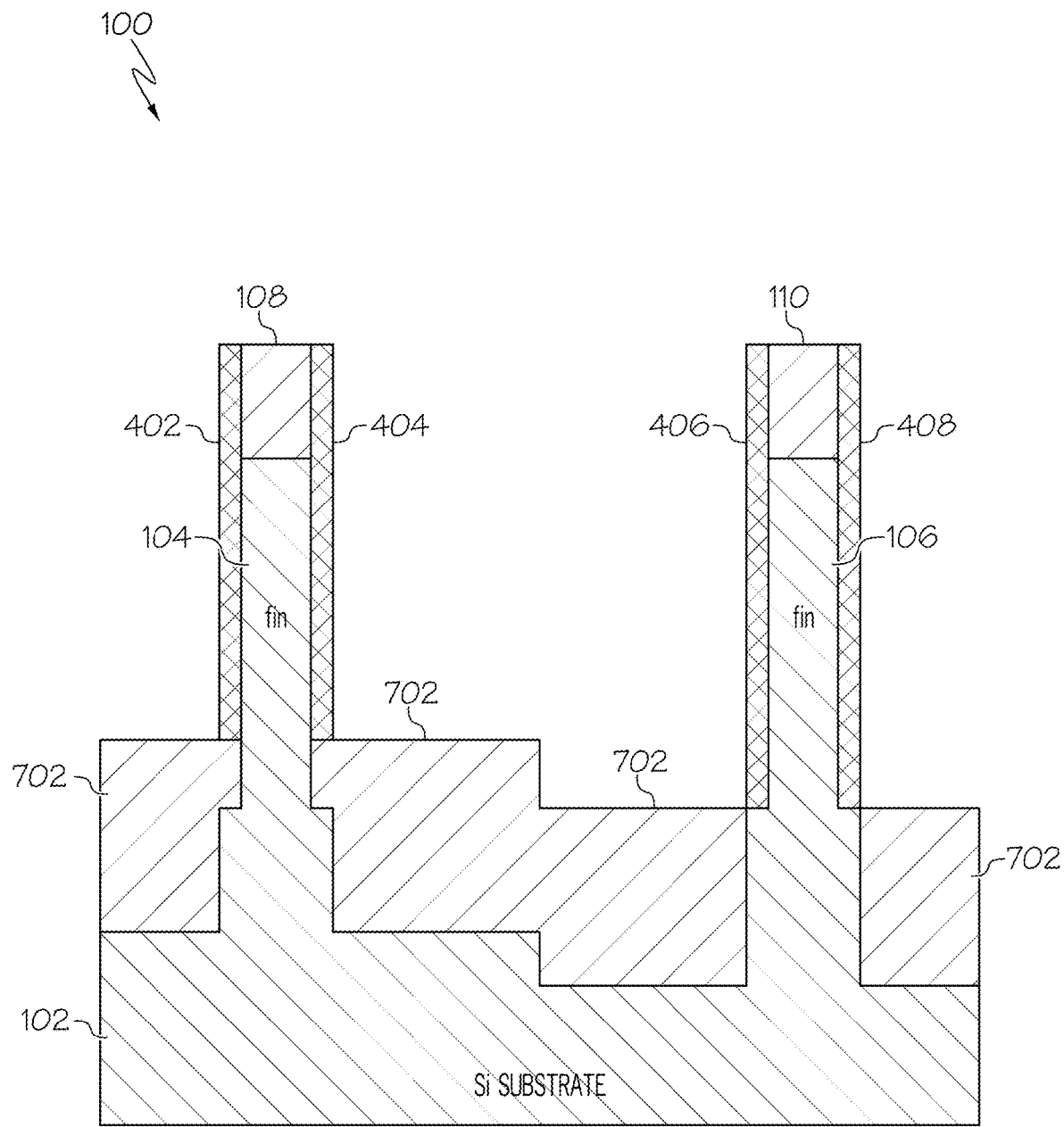
FIG. 7 is a cross-sectional side view of the partial semiconductor structure of FIG. 6 at a point in the example fabrication process following epitaxial growth of a bottom source drain layer in the first fin region and in the second fin region.

As shown in FIG. 7, the fabrication process epitaxially grows a bottom source/drain layer 702 in both the first fin region and in the second fin region. An epitaxially grown first bottom source/drain layer 702 in the first fin region fills the recesses 602 (compare FIG. 7 to FIG. 6). The epitaxially grown first bottom source/drain layer 702 in the first fin region has a first height extending vertically upwards along the first vertical fin 104 from a top surface of the semiconductor substrate 102, and a second bottom source/drain layer 702 has a second height extending vertically upwards along the second vertical fin 106 from a top surface of the semiconductor substrate 102. According to the present example, the first height is substantially the same as the second height. That means in the present example, that a difference between the first height and the second height is less than one nanometer.

In-situ doping (e.g., phosphorus doped Si for nFET, and boron-doped SiGe for pFET) can be performed in the process of forming by epitaxial growth the first bottom source/drain layer on the sidewalls of the first vertical fin 104 and in the process of forming by epitaxial growth the second bottom source/drain layer on the sidewalls of the second vertical fin 106.

Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metalorganic chemical vapor deposition (MOCVD), ultrahigh vacuum chemical vapor deposition (UHVCVD), low-pressure chemical vapor deposition (LPCVD), limited reaction processing CVD (LRPCVD), or other suitable process. Epitaxial silicon, silicon germanium (SiGe), germanium (Ge), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ cm$^{-3}$ to $3\times10^{21}$ cm$^{-3}$, or preferably between $2\times10^{20}$ cm$^{-3}$ to $3\times10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

Alternatively, the bottom source/drain region can be doped by other suitable doping technique, including but not limited to, ion implantation, gas phase doping, plasma doping, plasma immersion ion implantation, cluster doping, infusion doping, liquid phase doping, solid phase doping, in-situ epitaxy growth, or any suitable combination of those techniques.

Figure 8:
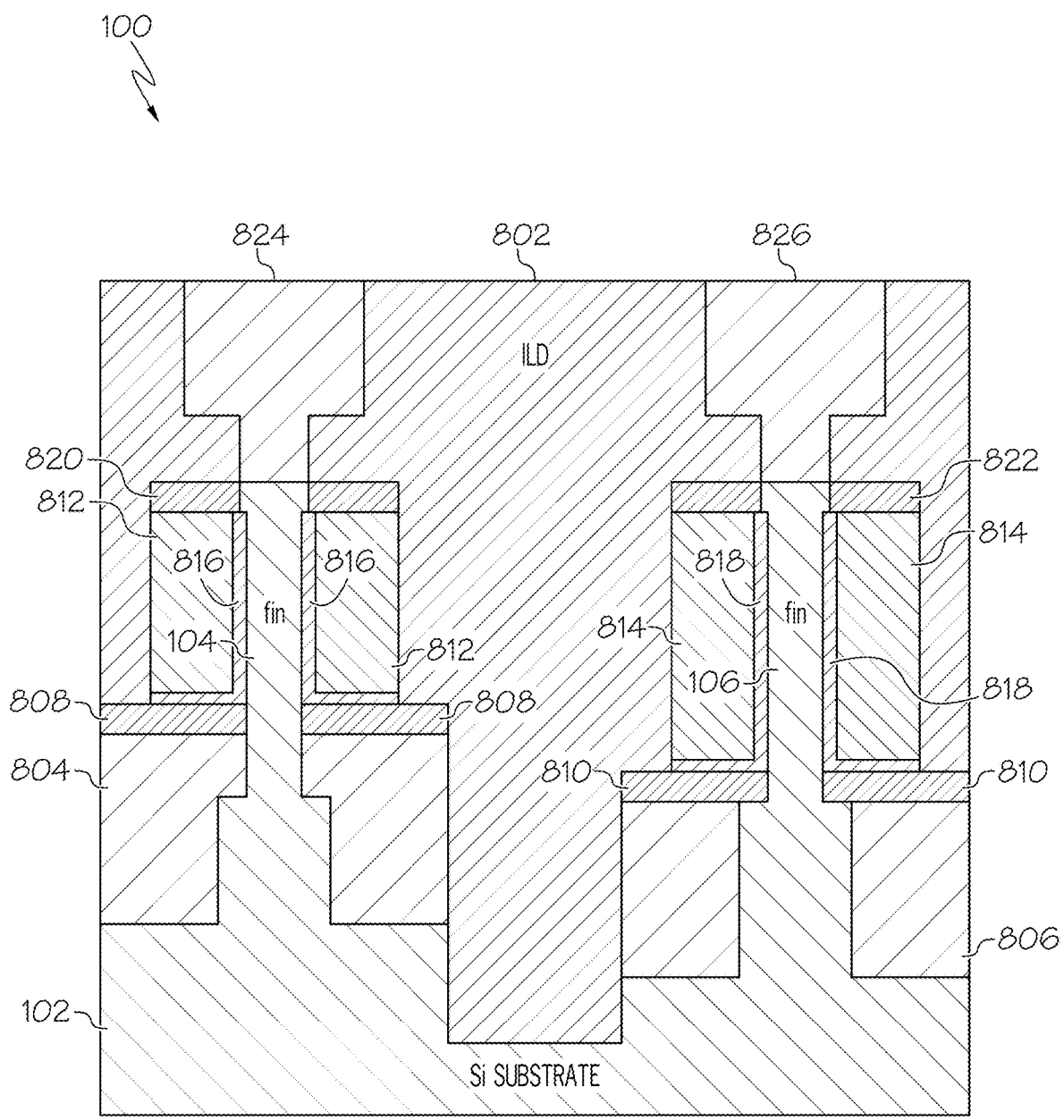
FIG. 8 is a cross-sectional side view of the partial semiconductor structure of FIG. 7 at a point in the example fabrication process following formation of a first vertical fin FET in the first fin region and a second vertical fin FET in the second fin region, the first vertical fin FET having a gate length that is different from a gate length of the second vertical fin FET.

The fabrication process continues, as shown in FIG. 8, by performing vertical fin FET fabrication process steps to form in each of the first fin region and the second fin region, the following elements: a bottom spacer 808, 810, gate dielectric 816, 818, and gate conductor 812, 814, disposed on the bottom spacer 808, 810, a top spacer 820, 822, interlevel dielectric (ILD) 802, and a top source/drain layer 824, 826.

Figure 9:
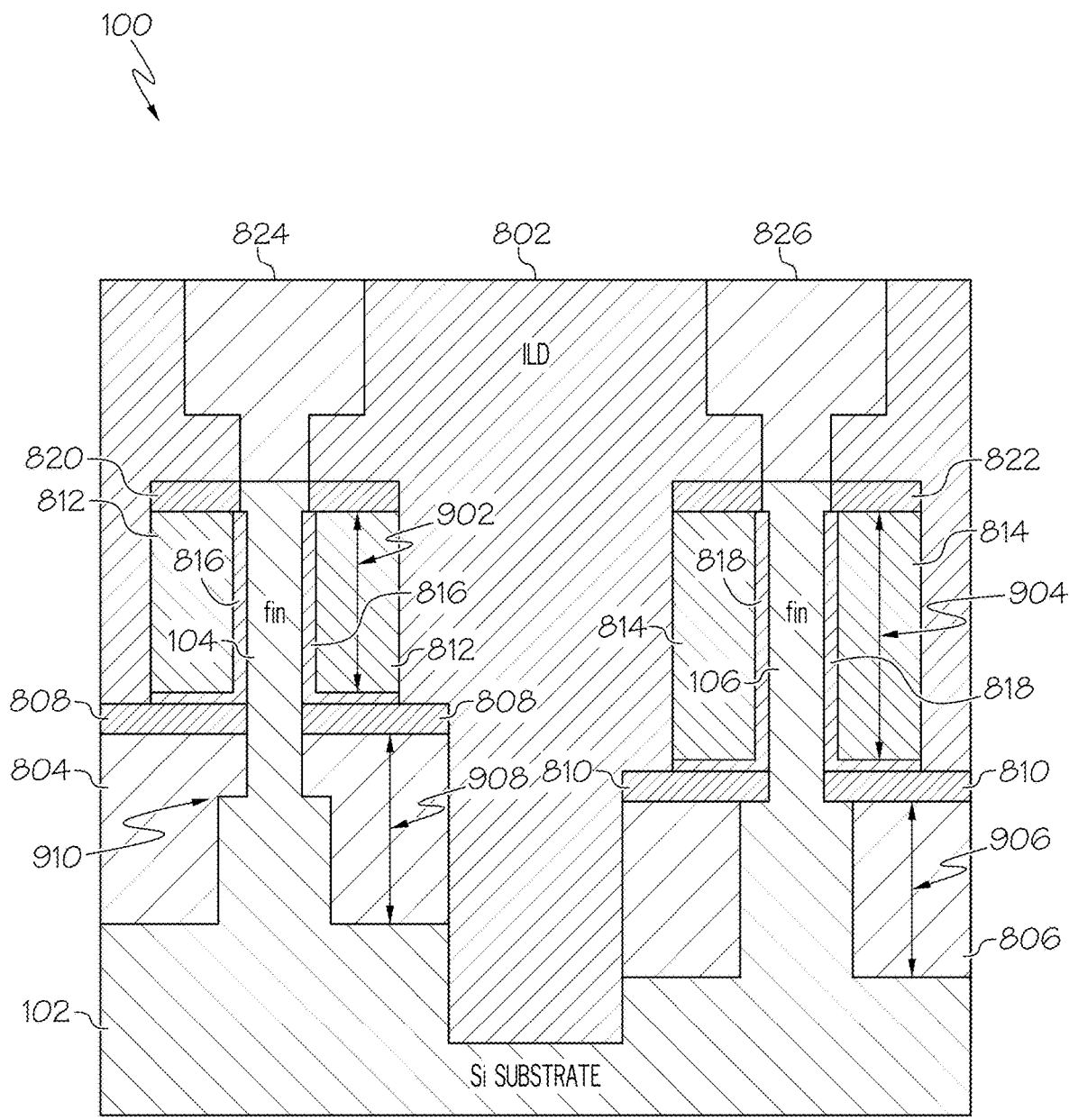
FIG. 9 shows the partial semiconductor structure of FIG. 8, highlighting certain unique features of the first vertical fin FET in the first fin region and the second vertical fin FET in the second fin region, according to an embodiment of the present invention.
Figure 10:
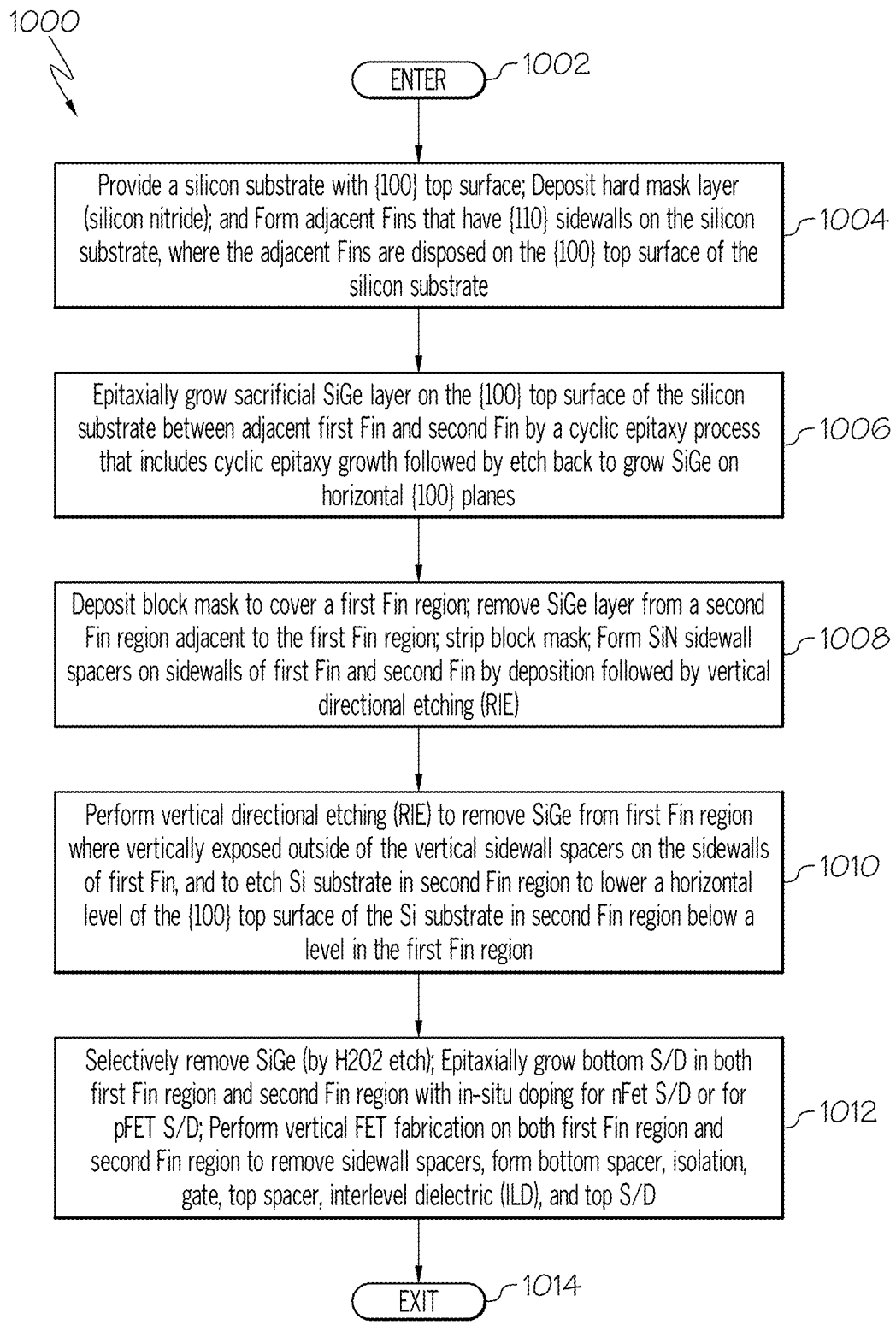
FIG. 10 is an operational flow diagram illustrating an example process for fabricating multiple vertical fin FET devices on a circuit supporting substrate, according to an embodiment of the present invention.

More specifically, with reference to FIGS. 8 and 9, the vertical fabrication process is performed on both the first fin region and on the second fin region as follows. Remove the sidewall spacers 402, 404, 406, 408, from respective first vertical fin 104 and second vertical fin 106. Then, form bottom spacer layer 808, 810, directly on the top surface of the bottom source/drain layer 804 in the first fin region and the bottom source/drain layer 806 in the second fin region. The fabrication process, according to the example, forms a first gate (e.g., including a first high-k gate dielectric 816 and a first gate conductor 812) having a first length 902 vertically along the first vertical fin 104 and disposed directly on the bottom spacer 808 in the first fin region. The fabrication process, according to the example, forms a second gate (e.g., including a second high-k gate dielectric 818 and a second gate conductor 814) having a second gate length 904 vertically along the second vertical fin 106 and disposed directly on the bottom spacer 810 in the second fin region. The first gate length 902 of the first gate 812, 816, is smaller than the second length 904 of the second gate 814, 818. That is, according to the example, a difference between the first gate length 902 and the second gate length 904 is measured to be in a range from two nanometers up to five nanometers, or more.

The fabrication process continues to form a top spacer layer 820 directly on a top surface of the first gate 812, 816, in the first fin region and a top spacer layer 822 directly on a top surface the second gate 814, 818, in the second fin region. Interlevel dielectric fill is deposited in the first fin region and in the second fin region to isolate a first vertical fin FET from a second vertical fin FET. According to the example fabrication process, a top source/drain layer 824 is formed, such as by epitaxial growth, on a top surface of the top spacer layer 820 in the first fin region to form a first vertical fin FET. A top source/drain layer 826 on a top surface of the top spacer layer 822 is formed, such as by epitaxial growth, in the second fin region to form a second vertical fin FET. The fabrication process, according to the example, forms the top source/drain layer 824, 826, using epitaxial growth while also performing in-situ doping (or other suitable doping technique such as described above) to form one of an nFET source/drain or a pFET source/drain for the top source/drain layer 824 in the first fin region and for the top source/drain layer 826 in the second fin region.

In this example fabrication process, as has been discussed above, a first vertical fin FET and a second vertical fin FET have been formed on the semiconductor substrate 102. The first gate length 902 of the first gate 812, 816, is smaller than the second gate length 904 of the second gate 814, 818. In this way, a circuit design can optimize power and performance parameters for the first vertical fin FET and the second vertical fin FET. The shorter gate length vertical transistor can have higher performance (e.g., higher speed) and higher power consumption, while the longer gate length vertical transistor can have lower performance (e.g., lower speed) and lower power consumption. The above example fabrication process allows very precise tuning of different gate lengths for different vertical fin FET transistors on the same circuit supporting substrate 102, to optimize vertical transistor performance and power consumption parameters for various circuit design requirements.

It should be noted that the fabrication process discussed above, according to various embodiments of the invention, provides unique distinguishing features in a first vertical fin FET and a second vertical fin FET disposed on a same semiconductor substrate 102.

As a first example of unique features of a semiconductor structure 100 fabricated according to the fabrication process described above, as shown in FIG. 9, a first gate length 902 of a first gate 812, 816, in a first vertical fin FET is different from a second gate length 904 of a second gate 814, 818, in a second vertical fin FET. A difference between the first gate length 902 and the second gate length 904 can be in a range from two nanometers up to five nanometers, or more. This difference in gate lengths between vertical transistors on the same semiconductor substrate 102 can be precisely fabricated according to the semiconductor fabrication methods discussed herein. Additionally, according to the example, a bottom source/drain layer 804 of the first vertical fin FET has a first height 908 extending vertically upwards along the first fin 104 from a top surface of the semiconductor substrate 102, and up to a bottom level of the bottom spacer layer 808 of the first vertical fin FET. In the same semiconductor structure 100, the bottom source/drain layer 806 of the second vertical fin FET has a second height 906 extending vertically upwards along the second fin 106 from a top surface of the semiconductor substrate 102 and up to a bottom level of the bottom spacer layer 810 of a second vertical fin FET, where the first height 908 is substantially the same height as the second height 906. By "substantially the same height" it is intended to mean that the difference between the first height 908 and the second height 906 is measured as being less than one nanometer. In the same semiconductor structure 100, the second length 904 of the second gate 814, 818, may be a few nanometers (e.g., from two nanometers up to five nanometers) greater than the first length 902 of the first gate 812, 816.

As a second example of unique features of the semiconductor structure 100 fabricated according to the example fabrication process described above, as shown in FIG. 9, the first fin 104 includes a staircase feature 910 inside the bottom source/drain layer 804 of the first vertical fin FET while in the same semiconductor structure 100 the second fin 106 does not include a staircase feature inside the bottom source/drain layer 806 of the second vertical fin FET. The staircase feature 910 of the first fin 104, as shown in FIG. 9, includes a step from a vertically lower portion of the first fin 104 to a vertically higher portion of the first fin 104 inside the bottom source/drain layer 804 of the first vertical fin FET. It is noted that the vertically lower portion of the first fin 104 in the staircase feature 910 has a first horizontal width and the vertically higher portion of the first fin 104 in the staircase feature 910 has a second horizontal width, where the first horizontal width is greater than the second horizontal width.

Although specific embodiments of the invention have been disclosed, those having ordinary skill in the art will understand that changes can be made to the specific embodiments without departing from the scope of the invention. The scope of the invention is not to be restricted, therefore, to the specific embodiments, and it is intended that the appended claims cover any and all such applications, modifications, and embodiments within the scope of the present invention.

It should be noted that some features of the present invention might be used in one embodiment thereof without use of other features of the present invention. As such, the foregoing description should be considered as merely illustrative of the principles, teachings, examples, and exemplary embodiments of the present invention, and not a limitation thereof.

In addition, these embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. A semiconductor structure comprising:
   a first vertical fin field-effect transistor formed on a semiconductor substrate, the first vertical fin field-effect transistor comprising a first vertical fin, a first bottom source/drain junction layer disposed on the semiconductor substrate and a first gate disposed on the first bottom source/drain junction layer, the first gate having a first gate length; and
   a second vertical fin field-effect transistor formed on the semiconductor substrate, the second vertical fin field-effect transistor comprising a second vertical fin, a second bottom source/drain junction layer disposed on the semiconductor substrate and a second gate disposed on the second bottom source/drain junction layer, the second gate having a second gate length that is greater than the first gate length, the first vertical fin including a staircase feature inside the first bottom source/drain junction layer and the second vertical fin does not include a staircase feature inside the second bottom source/drain junction layer.

2. The semiconductor structure of claim 1, wherein the staircase feature includes a step from a vertically lower portion of the first vertical fin to a vertically higher portion of the first vertical fin.

3. The semiconductor structure of claim 2, wherein the vertically lower portion of the first vertical fin in the staircase feature has a first horizontal width and the vertically higher portion of the first vertical fin in the staircase feature has a second horizontal width, the first horizontal width being greater than the second horizontal width.

4. The semiconductor structure of claim 1, wherein the first bottom source/drain junction layer has a first height extending vertically upwards along the first vertical fin from a top surface of the semiconductor substrate, and the second bottom source/drain junction layer has a second height extending vertically upwards along the second vertical fin from a top surface of the semiconductor substrate, the first height being substantially the same as the second height.

5. An integrated circuit comprising:
a circuit supporting substrate; and
a semiconductor structure, the semiconductor structure comprising:
a first vertical fin field-effect transistor formed on a semiconductor substrate, the first vertical fin field-effect transistor comprising a first vertical fin, a first bottom source/drain junction layer disposed on the semiconductor substrate and a first gate disposed on the first bottom source/drain junction layer, the first gate having a first gate length; and
a second vertical fin field-effect transistor formed on the semiconductor substrate, the second vertical fin field-effect transistor comprising a second vertical fin, a second bottom source/drain junction layer disposed on the semiconductor substrate and a second gate disposed on the second bottom source/drain junction layer, the second gate having a second gate length that is greater than the first gate length, the first vertical fin including a staircase feature inside the first bottom source/drain junction layer and the second vertical fin does not include a staircase feature inside the second bottom source/drain junction layer.

6. The integrated circuit of claim 5, wherein the staircase feature includes a step from a vertically lower portion of the first vertical fin to a vertically higher portion of the first vertical fin.

7. The integrated circuit of claim 6, wherein the vertically lower portion of the first vertical fin in the staircase feature has a first horizontal width and the vertically higher portion of the first vertical fin in the staircase feature has a second horizontal width, the first horizontal width being greater than the second horizontal width.

8. The integrated circuit of claim 5, wherein the first bottom source/drain junction layer has a first height extending vertically upwards along the first vertical fin from a top surface of the semiconductor substrate, and the second bottom source/drain junction layer has a second height extending vertically upwards along the second vertical fin from a top surface of the semiconductor substrate, the first height being substantially the same as the second height.

9. A semiconductor structure comprising:
a semiconductor substrate;
a first vertical fin field-effect transistor formed on the semiconductor substrate, the first vertical fin field-effect transistor comprising a first vertical fin, a first bottom source/drain junction layer disposed on the semiconductor substrate and a first gate, including a first high-k gate dielectric and a first gate conductor, disposed on the first bottom source/drain junction layer, the first gate having a first gate length vertically along the first vertical fin; and
a second vertical fin field-effect transistor formed on the semiconductor substrate, the second vertical fin field-effect transistor comprising a second vertical fin, a second bottom source/drain junction layer disposed on the semiconductor substrate and a second gate, including a second high-k gate dielectric and a second gate conductor, disposed on the second bottom source/drain junction layer, the second gate having a second gate length vertically along the second vertical fin that is greater than the first gate length, the first vertical fin including a staircase feature inside the first bottom source/drain junction layer and the second vertical fin does not include a staircase feature inside the second bottom source/drain junction layer.

10. The semiconductor structure of claim 9, wherein the staircase feature includes a step from a vertically lower portion of the first vertical fin to a vertically higher portion of the first vertical fin.

11. The semiconductor structure of claim 10, wherein the vertically lower portion of the first vertical fin in the staircase feature has a first horizontal width and the vertically higher portion of the first vertical fin in the staircase feature has a second horizontal width, the first horizontal width being greater than the second horizontal width.

12. The semiconductor structure of claim 9, wherein the first bottom source/drain junction layer has a first height extending vertically upwards along the first vertical fin from a top surface of the semiconductor substrate, and the second bottom source/drain junction layer has a second height extending vertically upwards along the second vertical fin from a top surface of the semiconductor substrate, the first height being substantially the same as the second height.

13. The method of claim 12, wherein a difference between the first height and the second height is less than one nanometer.

14. The semiconductor structure of claim 9, wherein each of the first bottom source/drain layer and the second bottom source/drain layer comprises:
one of an nFET source/drain or a pFET source/drain.

15. The semiconductor structure of claim 9, wherein a difference between the first gate length and the second gate length is in a range from two nanometers up to five nanometers.

* * * * *